United States Patent [19]

Ebihara et al.

[11] 4,198,579
[45] Apr. 15, 1980

[54] INPUT CIRCUIT FOR PORTABLE ELECTRONIC DEVICES

[75] Inventors: Heihachiro Ebihara; Fukuo Sekiya, both of Tokorozawa; Takashi Yamada, Sayama, all of Japan

[73] Assignee: Citizen Watch Co., Ltd., Tokyo, Japan

[21] Appl. No.: 862,539

[22] Filed: Dec. 20, 1977

[30] Foreign Application Priority Data

Dec. 25, 1976 [JP] Japan .................................. 51/156681
Sep. 30, 1977 [JP] Japan .................................. 52/118093
Oct. 19, 1977 [JP] Japan .................................. 52/125394

[51] Int. Cl.² ............................................... H03K 5/00
[52] U.S. Cl. ............................. 307/247 A; 340/365 E
[58] Field of Search .................... 307/247 R, 247 A; 340/365 E; 58/23 R, 23 A, 23 BA, 50 R

[56] References Cited

U.S. PATENT DOCUMENTS

| | | | |
|---|---|---|---|
| 3,471,789 | 10/1969 | Nutting et al. | 307/247 A |
| 3,593,036 | 7/1971 | Ma et al. | 307/247 A |
| 3,795,823 | 3/1974 | Morgan et al. | 307/247 A |
| 4,078,376 | 3/1978 | Freeman | 58/23 R |

*Primary Examiner*—John Zazworsky
*Attorney, Agent, or Firm*—Sherman & Shalloway

[57] ABSTRACT

There is disclosed an input circuit for portable electronic devices comprising an exteriorly operable member for delivering an operating signal to a portable electronic device and including a first flip-flop set in synchronism with an edge of said operating signal, a second flip-flop for reading therein said operating signal and a reset signal preparing circuit supplied with an output from said second flip-flop and preparing a reset signal for said first flip-flop.

10 Claims, 9 Drawing Figures

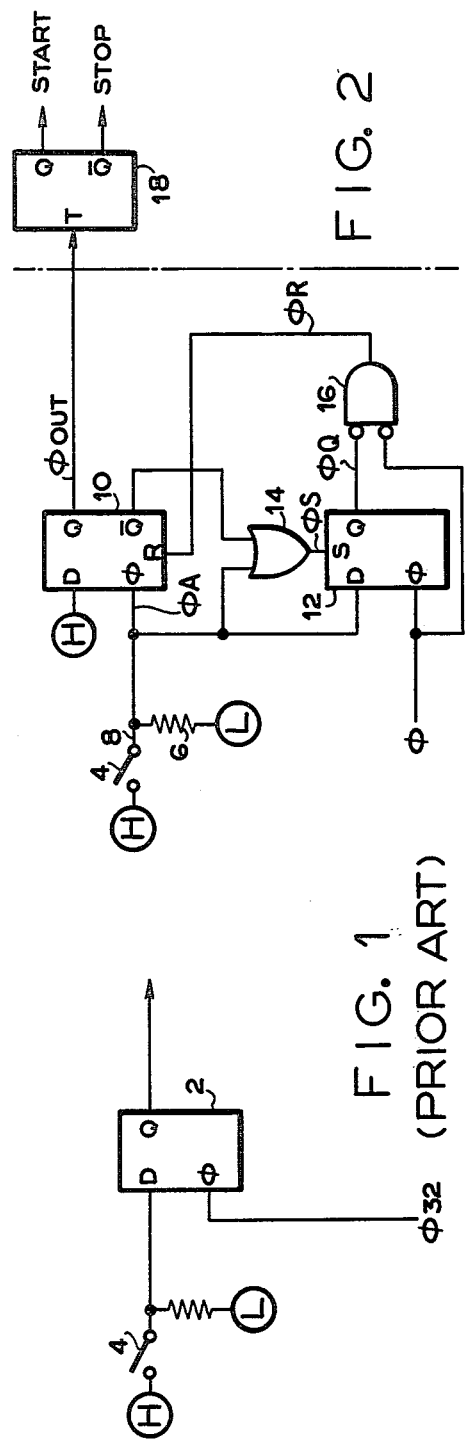
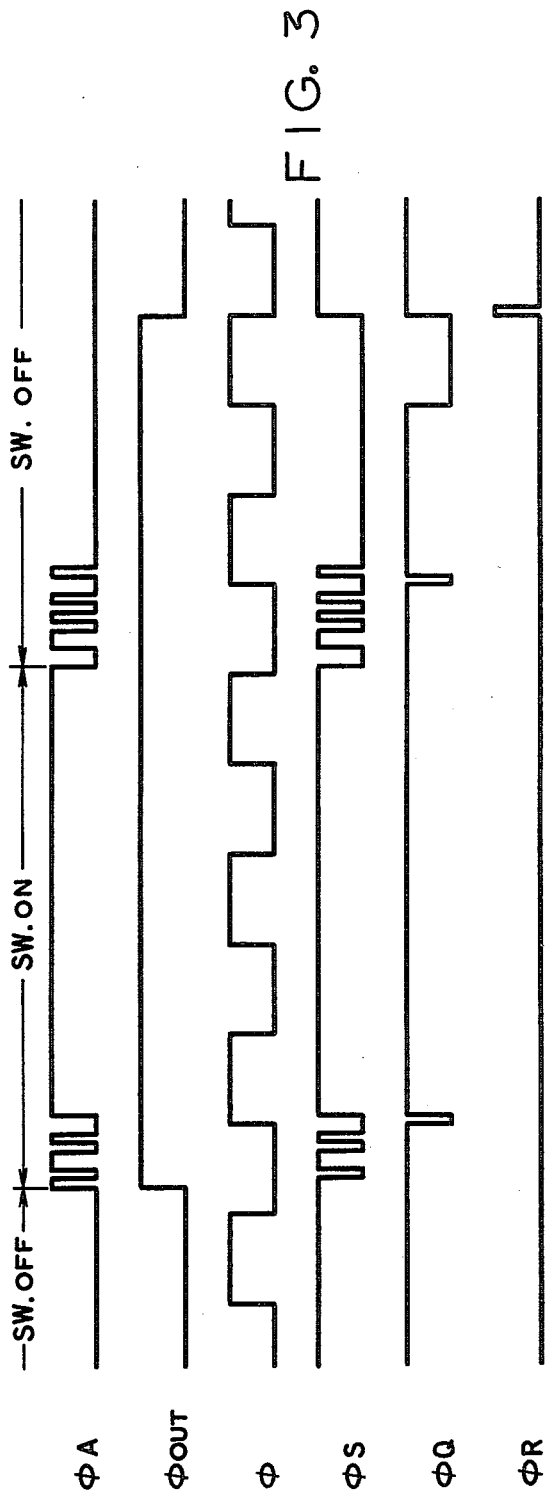

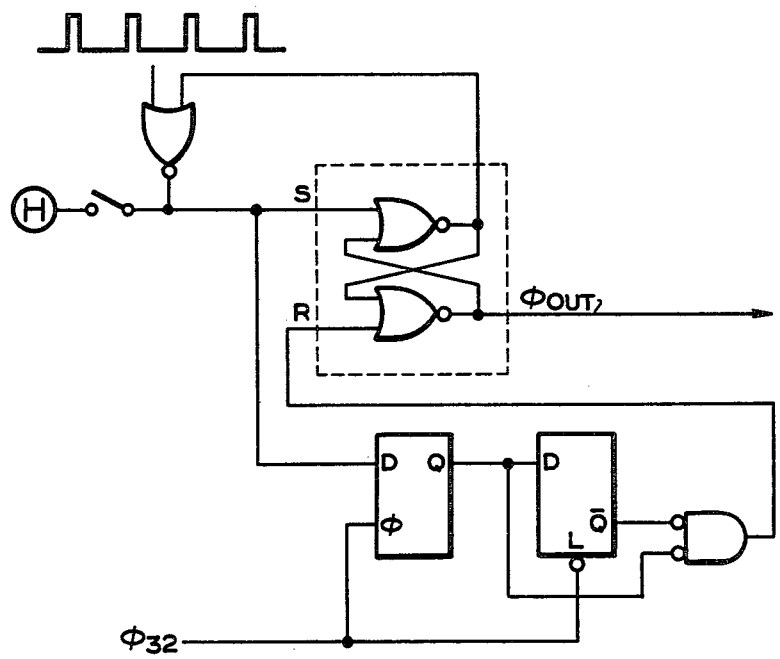
F I G. 7
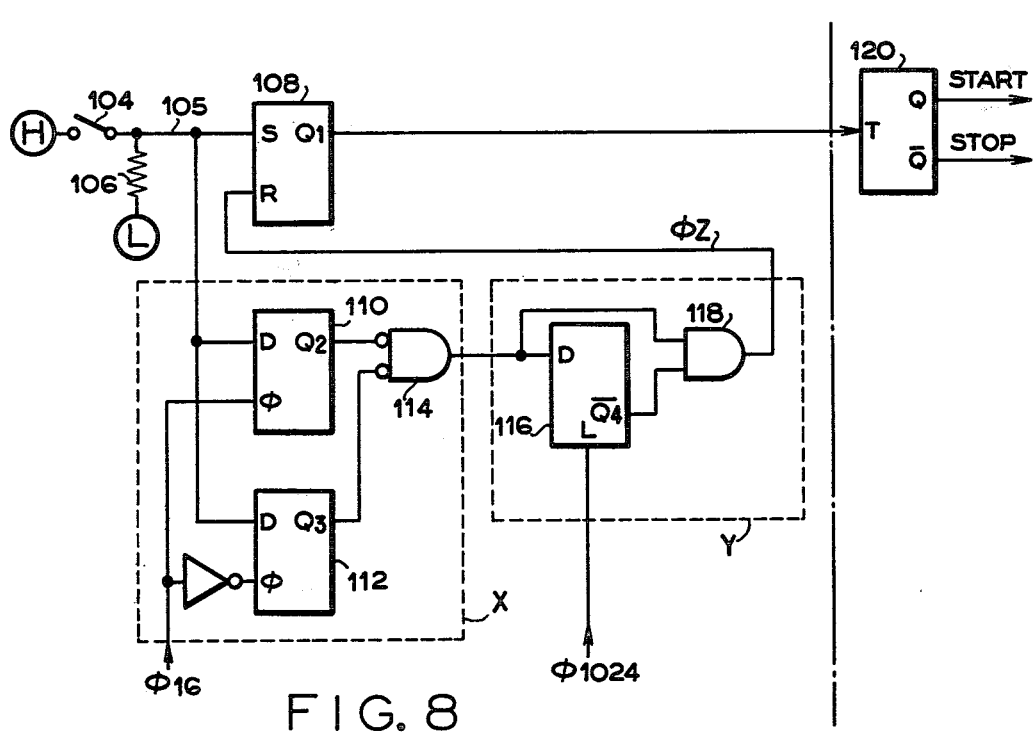
F I G. 8

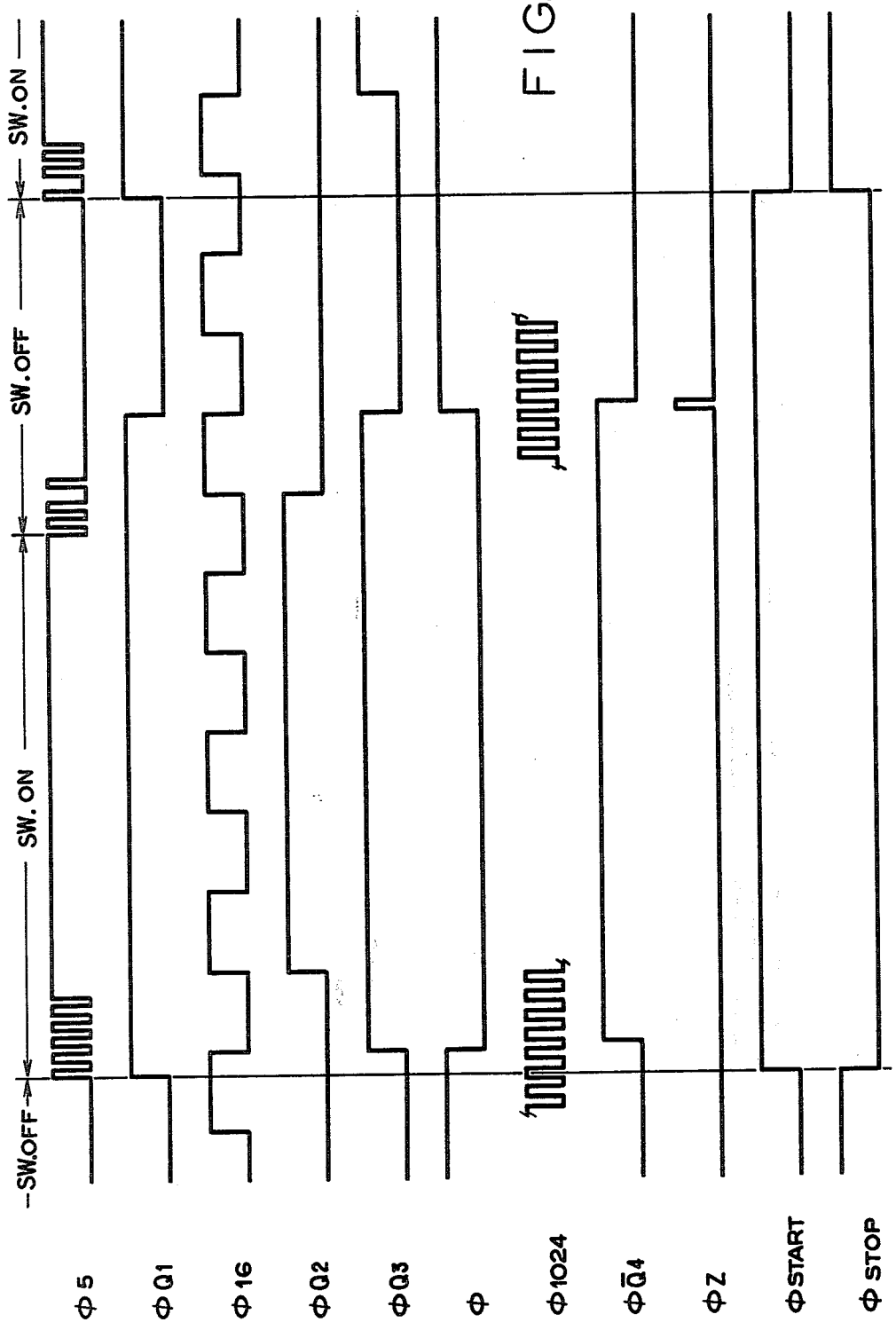

INPUT CIRCUIT FOR PORTABLE ELECTRONIC DEVICES

BACKGROUND OF THE INVENTION

1. Field of the Invention

This invention relates to an input circuit for portable electronic device and more particularly to an input circuit for a portable electronic device which functions also as a stop watch capable of measuring an extremely short time of at least 1/100 second.

2. Description of the Prior Art

Heretofore, it has been the common practice to use an input circuit shown in FIG. 1 as an input circuit for portable electronic devices such as an electronic timepiece. In such prior art input circuit shown in FIG. 1, provision is made of a flip-flop 2 for the purpose of removing chattering pulses induced in an operating signal delivered from an exteriorly operable member 4. If the flip-flop 2 is supplied with a reading in signal $\phi_{32}$ having a frequency of 32 Hz, it is possible to remove chattering pulses within 30 m.sec. Such conventional input circuit, however, has involved a delay of at most 30 m.sec. from the operation of the exteriorly operable member 4 to appearance of the operating signal on an output line of the flip-flop 2. If such conventional input circuit is used for an electronic stop watch capable of measuring an extremely short time up to 1/100 second figure, a measurement error of about 0.03 second is produced. In order to prevent such measurement error, it is necessary to increase the frequency of the reading in signal $\phi$ for the flip-flop 2 to at least 200 Hz. For this purpose, the period of chattering pulses induced in the operating signal produced by the exteriorly operable member 4 must be reduced to at most 5 m.sec. Provision of such exteriorly operable member 4 is extremely difficult in practice.

SUMMARY OF THE INVENTION

A principal object of the invention, therefore, is to provide an input circuit for portable electronic devices which can eliminate the above mentioned drawbacks which have been encountered with the conventional input circuit.

Another object of the invention is to provide an input circuit for portable electronic devices which can measure time in a highly precise manner with the aid of an exteriorly operable member which has commonly be used in practice.

Any further objects and advantages of the invention will be made clear by preferred embodiments of the invention which will be described with reference to the accompanying drawings.

A feature of the invention for accomplishing the above mentioned objects of the invention is the provision of an input circuit for portable electronic devices comprising an exteriorly operable member for delivering an operating signal from the outside to a portable electronic device as its input, a first flip-flop adapted to be set in synchronism with a raising up edge of said operating signal, a second flip-flop for reading therein said operating signal, and a reset signal preparing circuit supplied with an output delivered from said second flip-flop and preparing a reset signal for said first flip-flop.

BRIEF DESCRIPTION OF THE DRAWING

FIG. 1 is a circuit diagram showing a conventional input circuit for portable electronic devices;

FIG. 2 is a circuit diagram showing one embodiment of an input circuit according to the invention;

FIG. 3 is a timing chart for the input circuit shown in FIG. 2;

FIGS. 6 and 7 are modified embodiments of the input circuit shown in FIG. 4, respectively;

FIG. 8 is a circuit diagram of a further embodiment of an input circuit according to the invention; and FIG. 9 is a timing chart for the input circuit shown in FIG. 8.

DETAILED DESCRIPTION OF PREFERRED EMBODIMENT

Figure 4:
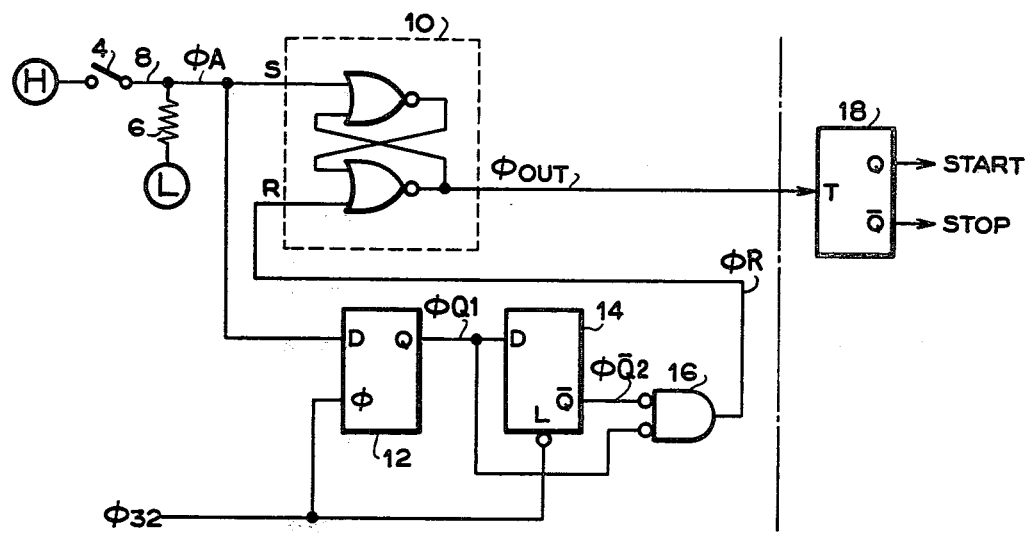
FIG. 4 is a circuit diagram showing another embodiment of an input circuit according to the invention.

The invention will now be described in greater detail with reference to the accompanying drawings.

In FIG. 2 is shown one embodiment of an input circuit according to the invention and in FIG. 3 is shown a timing chart illustrating the operation of the input circuit shown in FIG. 2. Referring to FIG. 2, reference numeral 4 designates an open-close switch with two terminals and 6 a resistor. On a line 8 appears an operating signal $\phi_A$ when the switch 4 is operated. The operating signal $\phi_A$ is applied to a clock input terminal of a first trigger set type flip-flop 10, a data input terminal of a second data type flip-flop 12 and one of input terminals of a gate 14. The trigger set type flip-flop 10 is a data type flip-flop. An inverted output signal from the first flip-flop 10 is applied to the other input terminal of the gate 14 whose output signal $\phi_S$ is applied to a set terminal of the second flip-flop 12. A periodic signal $\phi$ is applied to a clock input terminal of the second flip-flop 12 and one of input terminals of a gate 16 the other input terminal of which is supplied with an output signal $\phi_Q$ from the second flip-flop 12. A reset signal $\phi_R$ delivered from the gate 16 is applied to a reset terminal of the first flip-flop 10. The gate 16 constitutes a reset signal preparing circuit.

If the switch 4, which is an exteriorly operable member, is operated to close its contacts, the operating signal $\phi_A$ on the line 8 becomes raised from L to H. As shown in FIG. 3, the operating signal $\phi_A$ is of one inclusive of chattering pulses. The first-flop 10 is set in a trigger manner when the operating signal $\phi_A$ becomes raised from L to H in the first place and causes its output signal $\phi_{out}$ to change from L to H. The set signal $\phi_S$ is delivered to the second flip-flop 12 when the operating signal $\phi_A$ is H or when the output signal $\phi_{out}$ is L. As a result, the output signal $\phi_Q$ from the second flip-flop becomes L when the operating signal $\phi_A$ is L, the output signal $\phi_{out}$ is H and the periodic signal $\phi$ is raised from L to H. This condition always appears when the operation of the switch 4 has been completed. When both the output signal $\phi_Q$ and the periodic signal $\phi$ become L, the gate 16 functions to deliver a reset signal $\phi_R$ to reset the first flip-flop 10. During the chattering period of the operating signal $\phi_A$, the signal $\phi_Q$ becomes eventually L, but if the chattering period is within one-half the period of the periodic signal $\phi$, there is no risk of the reset signal $\phi_R$ being delivered from the gate 16 by the influence of the chattering signal. By taking such fact into consideration, it is preferable to use the periodic signal $\phi$ having a frequency on the order of 16 Hz.

As seen from FIG. 3, the output signal $\phi_{out}$ delivered from the input circuit according to the invention raises up as soon as the exteriorly operable member is operated and is lowered down after the operation of the exteriorly operable member has been completed. As a result, the use of the raising up edge of the output signal $\phi_{out}$ ensures a precise control of time. A toggle flip-flop 18 is shown for the sake of reference and becomes inverted by the raising up edge of the output signal $\phi_{out}$. If output signals from the toggle flip-flop 18 are used as signals for controlling START and STOP of a stop watch, it is capable of effecting time measurement in a highly precise manner without involving any delay from the operation of the exteriorly operable member.

Figure 5:
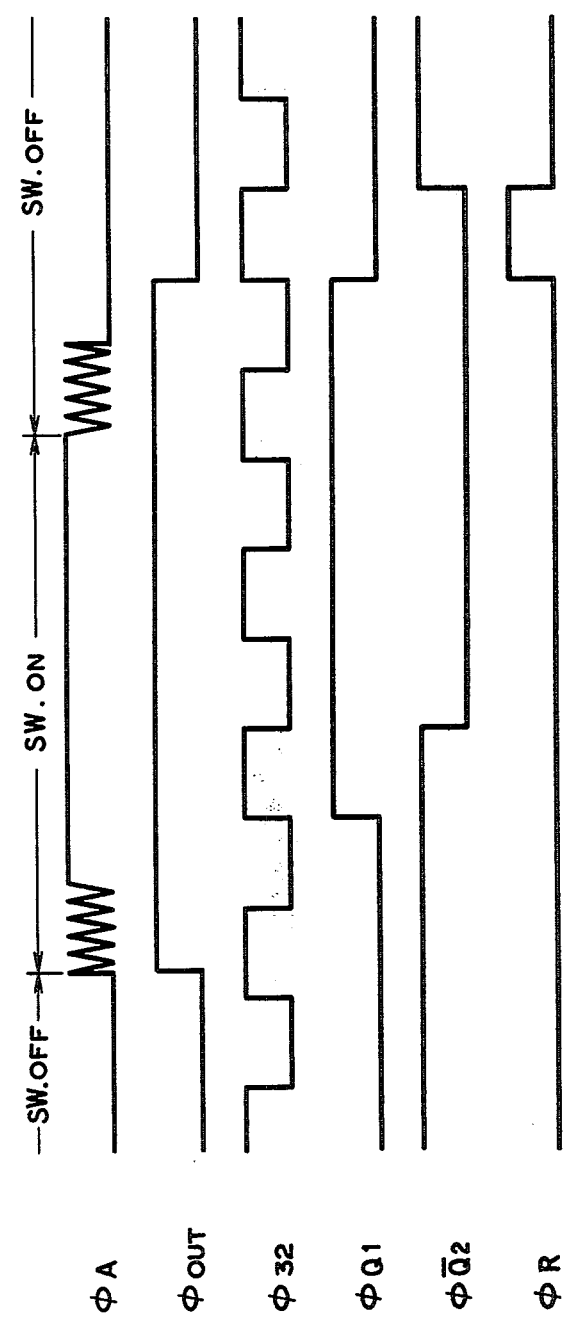
FIG. 5 is a timing chart for the input circuit shown in FIG. 4.

In FIG. 4 is shown another embodiment of an input circuit according to the invention and in FIG. 5 is shown a timing chart illustrating the operation of the input circuit shown in FIG. 5. An output signal $\phi_{Q1}$ from a data flip-flop 12 is applied to a data input terminal of a data-latch 14. A periodic signal $\phi_{32}$ having a frequency of 32 Hz. is applied to both clock terminals of the data flip-flop 12 and the data-latch 14.

An inverted output signal $\phi_{\overline{Q2}}$ from the data-latch 14 and the output signal $\phi_{Q1}$ are applied to a gate 16 which functions to effect negative AND and delivers a reset signal $\phi_R$ to a reset terminal of a set-reset flip-flop 10.

An output signal $\phi_{out}$ delivered from the set-reset flip-flop 10 constitutes an output signal from the input circuit according to the invention. In the present embodiment, the data flip-flop 12 constitutes a delay circuit and the data-latch 14 and gate 16 constitute a reset signal preparing circuit.

If a switch 4, which is an exteriorly operable member, is operated to close its contacts, the operating signal $\phi_A$ on the line 8 becomes raised from L to H. As shown in FIG. 5, the operating signal $\phi_A$ is of one inclusive of chattering pulse. The set-reset flip-flop 10 is set when the operating signal $\phi_A$ becomes raised from L to H in the first place and causes its output signal $\phi_{out}$ to change from L to H. The periodic signal $\phi_{32}$ causes the data flip-flop 12 to read therein the operating signal $\phi_A$ and deliver the output signal $\phi_{Q1}$ which is a delay signal which is prevented from the chattering pulses.

When the operation of the switch 4 has been completed to open its contacts, the operating signal $\phi_A$ becomes L and after a short delay the output signal $\phi_{Q1}$ is returned to L. As seen from FIG. 5, the gate 16 is responsive to the lowering down of the output signal $\phi_{Q1}$ to cause the gate 16 to deliver the reset signal $\phi_R$ to the set-reset flip-flop 10 so as to reset it.

As seen from the above, the output signal $\phi_{out}$ from the input circuit according to the invention raises up as soon as the exteriorly operable member is operated and is lowered down after the operation of the exteriorly operable member has been completed. As a result, the use of the raising up edge of the output signal $\phi_{out}$ ensures a precise time measurement. A toggle flip-flop 18 is shown for reference and becomes inverted by the raising up edge of the output signal $\phi_{out}$. If the output signal from the toggle flip-flop 18 is used as a signal for controlling START and STOP of a stop watch, it is possible to effect time measurement in a highly precise manner without involving any delay from the operation of the exteriorly operable member.

Figure 6:
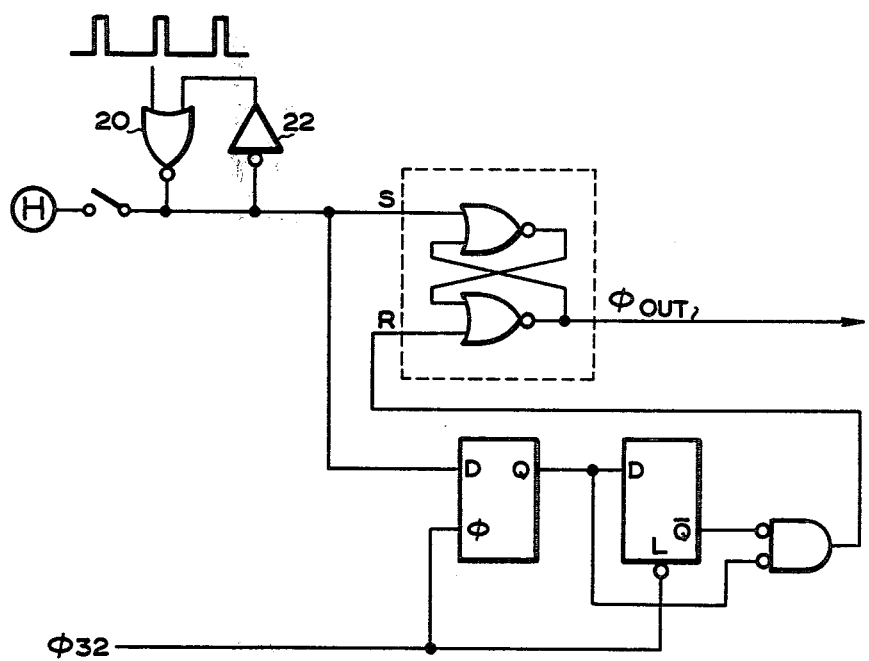

In FIG. 6 is shown a modified embodiment of the input circuit shown in FIG. 4. In the present embodiment, use is made of a NOR gate 20 and an inverter 22 instead of the resistor 6 shown in FIG. 4. To one of input terminals of the NOR gate 20 is applied a periodic signal having a small duty cycle. The construction described above makes it possible to omit the resistor 6 which constitutes a circuit element to be added to the outside of the input circuit according to the invention.

In FIG. 7 is shown a modified embodiment of the input circuit shown in FIG. 6. The construction shown in FIG. 7 makes it possible to omit the inverter 22 shown in FIG. 6.

In FIG. 8 is shown a further embodiment of an input circuit according to the invention and in FIG. 9 is shown a timing chart illustrating the operation of the input circuit shown in FIG. 8. In the present embodiment shown in FIG. 8, to a data flip-flop 110 is applied a periodic signal $\phi_{16}$ having a frequency of 16 Hz and to a data flip-flop 112 is applied a signal inverted from the periodic signal $\phi_{16}$. Output signals $\phi_{Q2}$ and $\phi_{Q3}$ from the data flip-flops 110 and 112 are applied to a gate 114 which functions to effect negative AND and delivers an output $\phi$ to a data input terminal D of a data-latch 116. To a clock input terminal L of the data-latch 116 is applied a signal $\phi_{1024}$ having a frequency of 1024 Hz. The data input signal to the data-latch 116 and an output signal $\phi_{\overline{Q4}}$ from the data-latch 116 are applied to an AND gate 118 which functions to effect AND operation and delivers an output signal $\phi_Z$ to a reset input terminal R of a set-reset flip-flop 108. In the present embodiment, the set-reset flip-flop 108 is set in synchronism with the raising up edge of the operating signal. Block X shows a discrimination circuit for discriminating the fact that the operable member 104 has not operated for a given time and block Y shows a detection circuit for detecting the lowering down of the operating signal. In the discrimination circuit X, the data flip-flops 110 and 112 and the gate 114 function to detect the fact that the exteriorly operable member 104 is not operated for at least a given time. In the detection circuit Y, the data-latch 116 and the gate 118 constitute a circuit for preparing a raising synchronous signal.

If the exteriorly operable member 104 is operated, an operating signal $\phi_A$ inclusive of chattering pulses appears on a line 105. The set-reset flip-flop 108 is set by the first chattering pulse of the operating signal $\phi_A$ to make its output signal $\phi_{Q1}$ H. If the operation of the exteriorly operable member 104 has been completed to open its contacts, the operating signal $\phi_A$ on the line 105 becomes L. This information is read in the data flip-flops 110, 112 within about 60 m.sec. to make both the output signals $\phi_{Q2}$, $\phi_{Q3}$ L. If both the output signals $\phi_{Q2}$, $\phi_{Q3}$ become L, the output $\phi$ from the gate 114 becomes H to detect the end of the operation of the exteriorly operable member 104. The inverted output $\phi_{\overline{Q4}}$ from the data-latch 116 becomes L at a time which is delayed from the time at which the output signal $\phi$ from the gate 114 becomes H by one-half period of the clock signal $\phi_{1024}$. As a result, the output signal $\phi_Z$ from the gate 118 becomes H in synchronism with the raising up edge of the detection signal and constitutes a raising up synchronous signal which continues for one-half period of the clock signal $\phi_{1024}$. This raising up signal $\phi_Z$ is delivered to the set-reset flip-flop 108 as its reset signal $\phi_R$, so that the output signal $\phi_{Q1}$ from the set-reset flip-flop 108 raises up as soon as the exteriorly operable member 104 is operated and is lowered down at a time which is delayed by several tens milli-seconds from the end of the operation of the exteriorly operable member 104. A toggle flip-flop 120 is shown for reference. To an input terminal T of the toggle flip-flop 120 is applied the output signal $\phi_{Q1}$ from the set-reset flip-flop 108. As a result, the toggle flip-flop 120 functions to deliver an output which is inverted everytime the output signal $\phi_{Q1}$ raises up. The use of the output signal from the toggle flip-flop 120 as a signal for controlling START and STOP of a stop watch provides the important advantage that a user of the stop watch can measure time in a highly precise manner without delay from the operation of the exteriorly operable member 104.

As stated hereinbefore, the use of the input circuit according to the invention ensures a removal of the error induced by the input circuit without specially conditioning an exteriorly operable member and provides the important advantage that a time measurement can be effected in a higly precise manner. The input circuit according to the invention is particularly adapted for use in a portable electronic device such as an electronic stop watch, an electronic timepiece which functions also as a stop watch, etc.

What is claimed is:

1. An input circuit for portable electronic devices comprising:
   (a) an exteriorly operable member for delivering an operating signal to a portable electronic device as its input;
   (b) a first flip-flop activated for inverting the output thereof when a raising up edge of said operating signal is received;
   (c) a second flip-flop for receiving said operating signal in response to a periodic signal;
   (d) a reset signal preparing circuit supplied with an output delivered from said second flip-flop and preparing a reset signal for said first flip-flop; and
   (e) a toggle type flip-flop connected to an output terminal of said first flip-flop for generating a start/stop signal for controlling the portable electronic device.

2. The input circuit according to claim 1, wherein said first flip-flop is composed of a trigger set type flip-flop.

3. The input circuit according to claim 1, wherein said exteriorly operable member is composed of a two terminal switch.

4. The input circuit according to claim 1, wherein said second flip-flop constitutes a delay circuit for delivering a delay signal for delaying said operating signal and said reset signal preparing circuit delivers a reset signal for said first flip-flop in response to a lowering down edge of said delay signal.

5. The input circuit according to claim 4, wherein said first flip-flop is composed of a set-reset flip-flop which is preceded by resetting thereof.

6. The input circuit according to claim 4, wherein said delay circuit is composed of a circuit for removing chattering pulses.

7. The input circuit according to claim 1, wherein said first flip-flop is composed of a set-reset flip-flop.

8. An input circuit for portable electronic devices comprising a two terminal switch, a first flip-flop activated for inverting the output thereof when an operating signal is received from said two terminal switch, and a detection circuit including a second flip-flop for receiving said operating signal in response to a periodic signal for detecting a lowering down edge of said operating signal, said first flip-flop being reset by an output signal delivered from said detection circuit.

9. The input circuit according to claim 8 further including a discrimination circuit for discriminating the fact that said operable member is not operated for a time longer than a given time, and said detection circuit further including a signal preparing circuit for preparing a raising up periodic signal from the output signal delivered from said discrimination circuit, said raising up periodic signal being a reset signal for said first flip-flop.

10. The input circuit according to claim 8, wherein said first flip-flop is composed of a set-reset flip-flop.

* * * * *